United States Patent
Sato

(10) Patent No.: US 11,094,809 B2
(45) Date of Patent: Aug. 17, 2021

(54) POWER MODULE AND REVERSE-CONDUCTING IGBT

(71) Applicant: FUJI ELECTRIC CO., LTD., Kawasaki (JP)

(72) Inventor: Shigeki Sato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 47 days.

(21) Appl. No.: 16/556,916

(22) Filed: Aug. 30, 2019

(65) Prior Publication Data

US 2019/0386125 A1  Dec. 19, 2019

Related U.S. Application Data

(63) Continuation of application No. PCT/JP2018/029142, filed on Aug. 2, 2018.

(30) Foreign Application Priority Data

Sep. 15, 2017  (JP) .............................. JP2017-178410

(51) Int. Cl.
   *H01L 29/739* (2006.01)
   *H01L 25/18* (2006.01)
   (Continued)

(52) U.S. Cl.
   CPC .......... *H01L 29/7397* (2013.01); *H01L 25/18* (2013.01); *H01L 27/0635* (2013.01);
   (Continued)

(58) Field of Classification Search
   CPC ..... H01L 25/16; H01L 25/18; H01L 27/0629; H01L 27/0635; H01L 28/60;
   (Continued)

(56) References Cited

U.S. PATENT DOCUMENTS 5,828,100 A * 10/1998 Tamba ................ H01L 29/1095
                                                        257/328
2014/0015005 A1  1/2014 Ishii
(Continued)

FOREIGN PATENT DOCUMENTS

JP  2011-134984 A  7/2011
JP  2014-13798 A  1/2014
(Continued)

OTHER PUBLICATIONS

International Search Report dated Sep. 11, 2018 in corresponding International Patent Application No. PCT/JP2018/029142.
(Continued)

*Primary Examiner* — Allan R Wilson

(57) ABSTRACT

A power module which includes a power semiconductor module chip, a driver chip and a charge storage element. The power semiconductor module chip is configured by forming an IGBT having a trench gate structure including a dummy trench gate, and a freewheeling diode for returning excess carrier of the emitter of the IGBT to the collector of the IGBT, in the same chip. The drive chip is used for driving the IGBT on/off. The power module is configured by packaging the power semiconductor module chip and the drive chip. The charge storage element that is connected between the gate and emitter of a dummy IGBT which can be pseudo-formed in order that the dummy trench gate be used in screening examinations.

12 Claims, 10 Drawing Sheets

(51) Int. Cl.
*H01L 27/06* (2006.01)
*H01L 49/02* (2006.01)
*H01L 29/06* (2006.01)
*H01L 29/861* (2006.01)
*H03K 17/567* (2006.01)

(52) U.S. Cl.
CPC .......... *H01L 28/60* (2013.01); *H01L 29/0696* (2013.01); *H01L 29/861* (2013.01); *H03K 17/567* (2013.01); *H03K 2217/0063* (2013.01); *H03K 2217/0072* (2013.01)

(58) Field of Classification Search
CPC ............... H01L 29/0696; H01L 29/083; H01L 29/1095; H01L 29/7397; H01L 29/78; H01L 29/861; H03K 17/567
See application file for complete search history.

(56) References Cited

U.S. PATENT DOCUMENTS

| | | | |
|---|---|---|---|
| 2016/0308038 | A1 | 10/2016 | Sato |
| 2017/0194954 | A1 | 7/2017 | Chen et al. |
| 2018/0350960 | A1* | 12/2018 | Naito .................... H01L 21/743 |
| 2019/0312113 | A1* | 10/2019 | Chen ................... H01L 29/0619 |

FOREIGN PATENT DOCUMENTS

| | | |
|---|---|---|
| JP | 2014-53552 A | 3/2014 |
| JP | 2016-82167 A | 5/2016 |
| JP | 2017-123709 A | 7/2017 |
| WO | 2016/006376 A1 | 1/2016 |

OTHER PUBLICATIONS

Written Opinion of the International Searching Authority dated Sep. 11, 2018 in corresponding International Patent Application No. PCT/JP2018/029142.

* cited by examiner

POWER MODULE AND REVERSE-CONDUCTING IGBT

CROSS-REFERENCE TO RELATED APPLICATIONS

This application is a Continuation of PCT Application No. PCT/JP2018/029142 filed Aug. 2, 2018, which claims the benefit of Japanese Patent Application No. 2017-178410 filed Sep. 15, 2017. The disclosures of the prior applications are hereby incorporated by reference herein in their entireties.

TECHNICAL FIELD

The present invention relates to a power module and a reverse-conducting IGBT, and more particularly, to a power module and a reverse-conducting IGBT (an IGBT having a freewheeling diode formed in the same chip) with which it is possible to improve the control properties of an IGBT having a dummy trench gate structure.

BACKGROUND ART

With respect to IGBTs to be mounted on vehicles, high reliability is demanded, and it is required to prevent initial failures of gate oxide films in the manufacturing stage. As this type of IGBTs, reverse-conducting IGBTs each of which is an integration of an IGBT and a freewheeling diode are known, and for example, there are ones having dummy trench gates for reducing biasing of electric fields and improving the breakdown voltages. Even with respect to dummy trench gates, similarly to gate oxide films, securing quality is important, and for example, in JP-A-2014-53552, a structure which is configured by providing a screening examination pad for a dummy trench gate to be connected to an emitter terminal and be used when the structure becomes an actual product and in which the influence of the wires in the IGBT chip is less is disclosed.

However, according to the above-mentioned technology of JP-A-2014-53552, since reducing the influence of the wires in the IGBT chip, i.e. the influence of internal parasitic components somewhat is possible, but has a technical hurdle, there is a limit to the effect which can be obtained. Especially, in the case of forming, for example, an Intelligent Power Module (IPM) by packaging an IGBT chip, the influence of internal wires increases. Also, the technology of the related art has not considered a problem attributable to the characteristics of a reverse-conducting IGBT having a freewheeling diode, i.e. that according to change in the forward current flowing in the freewheeling diode, during a turn-off switching operation, in the reverse-conducting IGBT, noise occurs and the control properties deteriorate, at all.

SUMMARY

The present invention was made in view of the above-mentioned circumstances, and an object of the present invention is to provide a power module and a reverse-conducting IGBT with which it is possible to improve the control properties of an IGBT having a dummy trench gate structure.

In order to achieve the above-mentioned object, a power module according to a first aspect of the present invention is a power module which includes: a power semiconductor module chip that is configured by forming an IGBT having a trench gate structure including a dummy trench gate, and a freewheeling diode for returning excess carrier of the emitter of the IGBT to the collector of the IGBT, in the same chip; and a drive chip for driving the IGBT on/off, and is configured by packaging the power semiconductor module chip and the drive chip, and further includes a charge storage element that is connected between the gate and emitter of a dummy IGBT which can be pseudo-formed in order that the dummy trench gate be used in screening examinations.

Recently, IGBTs having trench gate structures including dummy trench gates formed for improving breakdown voltages have been mainstreamed. Such dummy trench gates also become objects of screening examinations in order to secure high reliability of IGBTs. In a reverse-conducting IGBT having a freewheeling diode and an IGBT formed in the same chip, during a turn-off switching operation, a steep change in the current flowing in the freewheeling diode becomes a cause of noise, and deteriorates the control properties of the reverse-conducting IGBT. One of the causes of the steep change of the current flowing in the freewheeling diode is the instantaneous electromotive force attributable to internal parasitic L/C/R components, and according to this instantaneous electromotive force, during an turn-off operation of the IGBT, the current flowing in the freewheeling diode changes steeply, and the potential of the gate and the emitter changes. If a charge storage element for suppressing generation of an instantaneous electromotive force is connected between the gate and emitter of a dummy IGBT which is formed corresponding to the dummy trench gate, steep change of the current flowing in the freewheeling diode is suppressed, and generation of noise is suppressed, whereby it becomes possible to improve the control properties of the IGBT.

Also, in order to achieve the above-mentioned object, a reverse-conducting IGBT according to a second aspect of the present invention is a reverse-conducting IGBT which is configured by forming an IGBT having a trench gate structure including a dummy trench gate, and a freewheeling diode for returning excess carrier of the emitter of the IGBT to the collector of the IGBT, in the same chip, and further includes a charge storage element that is connected between the gate and emitter of a dummy IGBT which can be pseudo-formed in order that the dummy trench gate be used in screening examinations.

According to the present invention, by suppressing steep change of the current flowing in the freewheeling diode and suppressing generation of noise, it becomes possible to improve the control properties of the IGBT having the dummy trench gate structure.

BRIEF DESCRIPTION OF THE DRAWINGS

FIG. 7A is a cross-sectional view corresponding to FIG. 4A, and FIG. 7B is a perspective cross-sectional view corresponding to FIG. 7A, and FIG. 7C is a cross-sectional view illustrating an example related to formation of a capacitor, and FIG. 7D is a top view illustrating an example related to formation of bidirectional diodes.

DETAILED DESCRIPTION OF EMBODIMENTS

Hereinafter, embodiments of the present invention will be described in detail with reference to the drawings. One of features of the present invention is, for example, that an element for suppressing generation of an instantaneous electromotive force which is a cause of noise during a turn-off switching operation is provided for a dummy trench gate.

Recently, a demand for forming a freewheeling diode and an IGBT in the same chip has been increasing. The reason is that by forming a freewheeling diode together with an IGBT in the same chip, it is possible to improve the maximum current rating of the module package. Meanwhile, since the freewheeling diode becomes able to flow a large current, the number of carriers also increases, and excess carrier which remains when turn-off switching of the IGBT is performed also increases. Excess carrier is a cause of noise during a turn-off switching operation. In the related art, since a freewheeling diode is formed in a chip different from a chip for an IGBT, even if a large current flows in the freewheeling diode, it is relatively difficult for the large current to influence the IGBT formed in the different chip. Therefore, in the case of a reverse-conducting IGBT having a freewheeling diode formed in the same chip, it is required to consider the influence of noise which is caused when a large current flows in the freewheeling diode. An example of such noise is a rise in instantaneous electromotive force.

Figure 1:
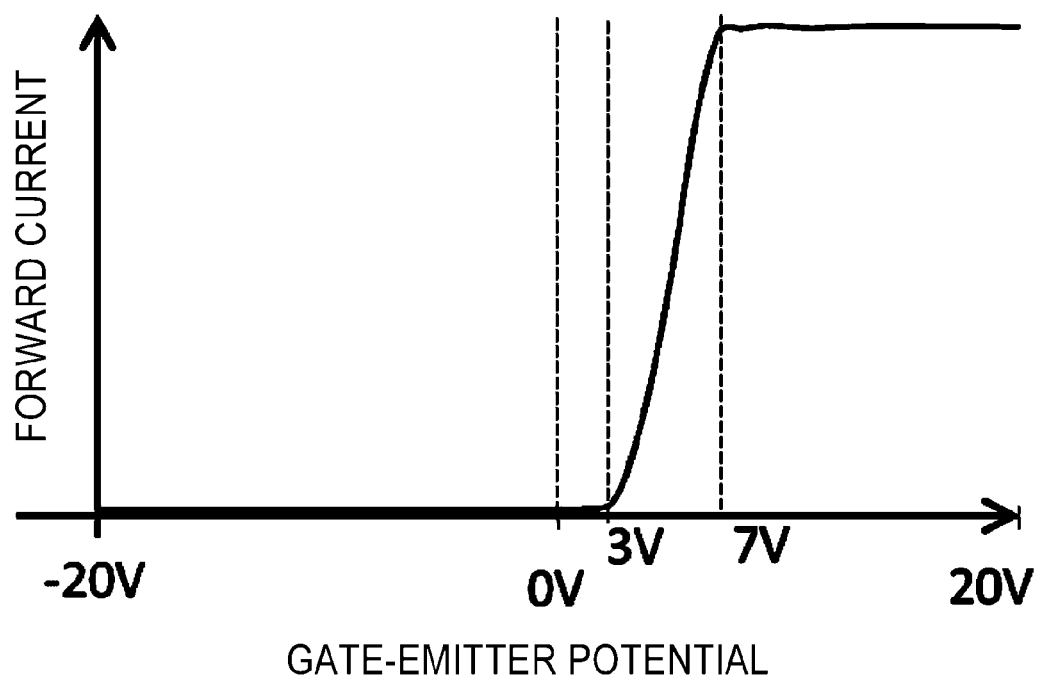
FIG. 1 is a graph illustrating the relation between the gate-emitter potential and the forward current flowing in a freewheeling diode, in a reverse-conducting IGBT

When turn-off switching of the reverse-conducting IGBT is performed, a large current flows in a freewheeling diode region in the same chip. As a result, in a very short period until the reverse-conducting IGBT is completely turned off (i.e. a period when the reverse-conducting IGBT is in a turn-off transient state), an instantaneous electromotive force is generated, and the emitter potential and the gate potential temporarily rise. This becomes a cause of noise, and deteriorates the control properties of the reverse-conducting IGBT. In other words, in order to completely turn off the reverse-conducting IGBT, it is required to release the charge stored in the gate; however, generation of the instantaneous electromotive force interferes with release of the charge stored in the gate of the reverse-conducting IGBT, and becomes an obstacle to make the turn-off switching characteristic good. As shown in the graph of FIG. 1, in the reverse-conducting IGBT having the trench gate structure, when the gate potential thereof is between about 3 V and about 7 V, the forward current flowing in the freewheeling diode has a steep change point.

In other words, it can be seen that when turn-off switching of the reverse-conducting IGBT is performed, a constant large current (remaining of excess carrier) continuously flows in the freewheeling diode until the gate potential lowers to a predetermined value. Since this is a cause of a rise in the instantaneous electromotive force, if it is possible to suppress the rise in the instantaneous electromotive force, it is possible to suppress noise during the turn-off switching operation of the reverse-conducting IGBT, and improve the control properties of the reverse-conducting IGBT.

It is known that such instantaneous electromotive force e has the following relations with L, C, and R components parasitic to the inside and outside of the IGBT chip.

$$e=IR \quad (1)$$

$$e=Ldi/dt \quad (2)$$

$$e=(1/C)\int idt \quad (3)$$

Herein, I is current, and R is wire resistance, and L is wire inductance, and C is wire capacitance.

During a turn-off switching operation, the above-mentioned instantaneous electromotive force e rises. As a result, the forward current flowing in the freewheeling diode steeply changes, and this becomes noise to deteriorate the control properties of the reverse-conducting IGBT (for example, the property of completely turning off the reverse-conducting IGBT at high speed).

In view of the above expressions (1) to (3), if it is possible to reduce the instantaneous electromotive force e, it is possible to suppress change in the emitter potential and the gate potential and suppress steep change in the forward current characteristic of the freewheeling diode which is a cause of noise. Meanwhile, the L component and the R component mentioned above is designed to the lowest limits in terms of the chip structure. For this reason, the inventor of the present invention achieved improvement in view of the C component.

Hereinafter, specific embodiments with which the control properties of reverse-conducting IGBTs have been improved in view of C components will be described in detail.

First Embodiment (Configuration)

Hereinafter, the configuration of a first embodiment will be described in detail.

Figure 2:
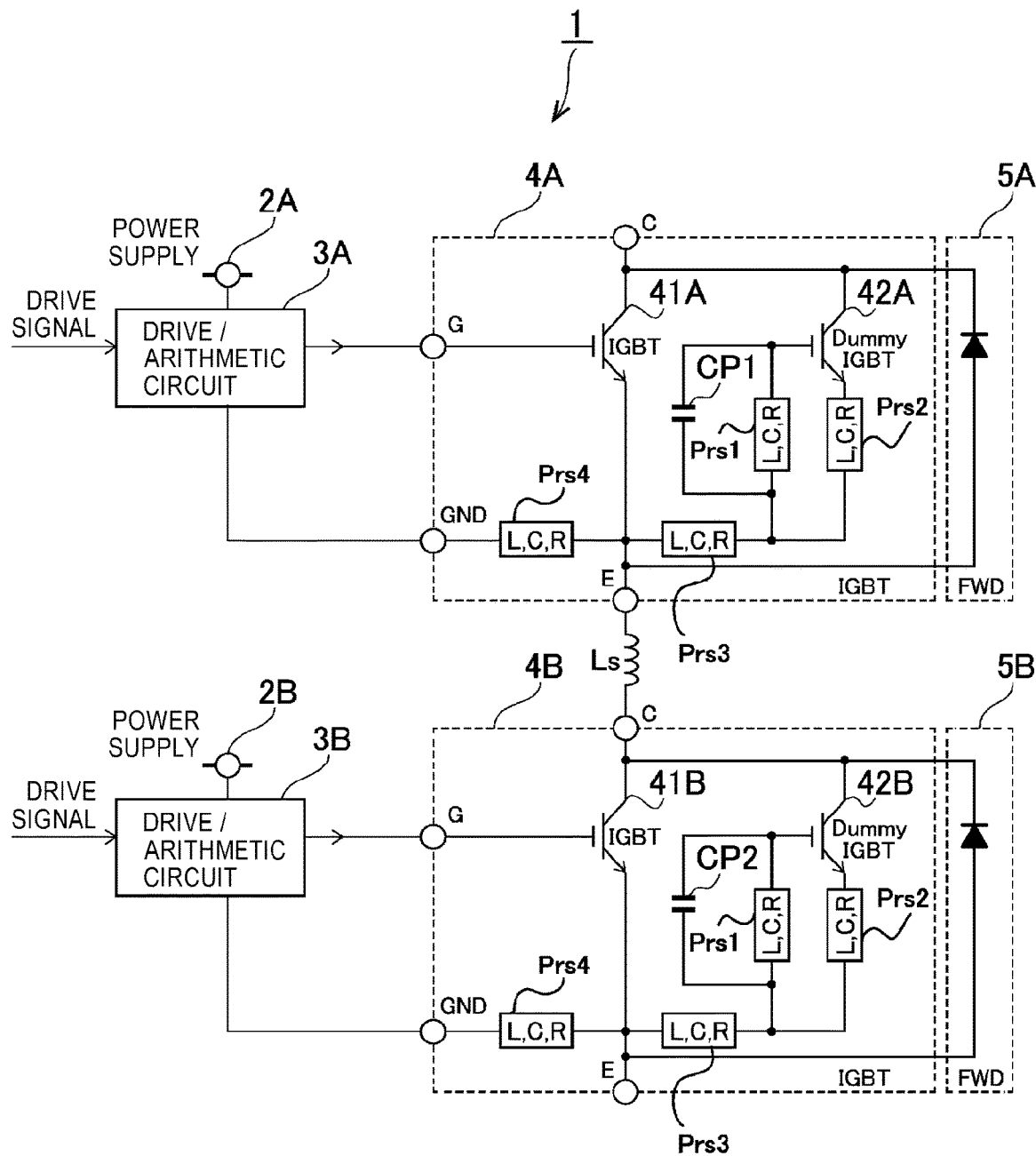
FIG. 2 is a circuit diagram illustrating the configuration of a power module according to a first embodiment of the present invention.

As shown in FIG. 2, an IPM system 1 of the present invention is configured to include DC power supplies 2A and 2B, first and second drive/arithmetic circuits 3A and 3B, IGBT sections 4A and 4B, freewheeling diode sections 5A and 5B, and an inductor Ls. Hereinafter, the details of the individual parts will be described.

The DC power supplies 2A and 2B are DC power supplies for applying gate signals for on/off switching operations to the gates of IGBTs 41A and 41B to be described below, via the first and second drive/arithmetic circuits 3A and 3B, respectively.

As for the first and second drive/arithmetic circuits 3A and 3B, for example, the first drive/arithmetic circuit 3A is a circuit for high side driving, and the second drive/arithmetic circuit 3B is a circuit for low side driving. The first and second drive % arithmetic circuits 3A and 3B generate gate signals for performing on or off switching operations of the IGBTs 41A and 41B, using the voltages of the DC power supplies 2A and 2B according to a drive signal which is supplied from the outside, and supplies the gate signals to the IGBTs 41A and 41B, respectively. With respect to the drive-arithmetic circuits 3A and 3B, since it is possible to use a technology according to the related art, a description thereof will not be made.

Since the IGBT sections 4A and 4B have the same configuration, only the IGBT section 4A will be described in detail. The IGBT section 4A includes the IGBT 41A, a collector terminal C, a gate terminal G, an emitter terminal E, and a ground terminal GND. The collector terminal C, the gate terminal G, and the emitter terminal E are connected to the collector, gate, and emitter of the IGBT 41A, respectively. Also, the gate terminal G is connected to the first drive/arithmetic circuit 3A, such that the gate signal is supplied to the gate of the IGBT 41A. Further, the ground terminal GND is a terminal for grounding the first drive/arithmetic circuit 3A and the emitter of the IGBT 41A, and is connected to the emitter of the IGBT 41A.

Moreover, the IGBT 41A includes a dummy IGBT 42A and a capacitor CP1.

The dummy IGBT 42A is, for example, a dummy IGBT which can be pseudo-formed in order to perform screening examinations on a dummy trench gate (shown in FIG. 4A) provided in order to reduce biasing of electric fields (alleviate local concentration of electric fields) and improve the breakdown voltage, and a pad to which a predetermined voltage is applied during a screening examination for checking whether there is an initial failure in the trench gate is connected to the gate (i.e. the dummy trench gate). The collector and emitter of the dummy IGBT 42A are connected to the collector and emitter of the IGBT 41A, respectively.

The capacitor CP1 is a capacitor which is disposed between the dummy trench gate and the emitter of the IGBT 41A and is connected after a screening examination in order to suppress generation of an instantaneous electromotive force e. Herein, the reason why the capacitor CP1 is connected after a screening examination is that since during a screening examination, by generating a potential difference between the dummy trench gate and the base region to apply a potential stress to a dummy trench gate insulting film, whether the dummy trench gate insulting film has a desired breakdown voltage, and the like are examined, it is required to prevent the capacitor from influencing any condition for the examination. Since the capacitor CP1 can more effectively suppress generation of an instantaneous electromotive force e as it gets closer to the wire for the dummy trench gate, in the present embodiment, the capacitor is provided in the chip in which the IGBT section 4A is formed. The capacitor CP1 is an example of a charge storage element for storing charge.

Also, L, C, and R in the drawings are examples of components parasitic to wires. In the present embodiment, the attention is focused on, as an example, parasitic L/C/R components prs1 on wires which are connected to the gates of the dummy IGBT 42A and so on, parasitic L/C/R components prs2 on wires which are connected to their emitters, and parasitic L/C/R components prs3 and prs4 on wires which extend from their gates and emitters to the ground.

The freewheeling diode sections 5A and 5B are connected in antiparallel with the IGBTs 41A and 41B, respectively, and return excess carrier of the emitter sides of the IGBTs 41A and 41B to the collector sides of the IGBTs 41A and 41B when the IGBTs 41A and 41B are turned off. In the present embodiment, the freewheeling diode sections 5A and 5B are formed together with the IGBTs 41A and 41B in the same chips, respectively, such that a single reverse-conducting IGBT is composed of the IGBT section 4A (4B) and the diode section 5A (5B). This reverse-conducting IGBT is a vertical type IGBT which uses a trench gate structure and in which the current flows in the vertical direction of the chip. In this case, the freewheeling diode sections 5A and 5B also are formed with trench structures, whereby the problem of lowering of the breakdown voltage is avoided.

In the IPM system 1 using the above-described configuration, if the high side is taken as an example, the first drive/arithmetic circuit 3A, and the IGBT section 4A and the freewheeling diode section 5A are electrically connected by wires of copper or the like, and are packaged into one with a resin or the like, and the power of the first drive/arithmetic circuit 3 is supplied from the DC power supply 2A to the single package. This is the same for the low side. The high side package and the low side package are connected to each other via the inductor Ls. In other words, the emitter terminal E of the IGBT section 4A and the collector terminal C of the IGBT section 4B are connected via the inductor Ls.

(Action)

Now, the operation of the IPM system 1 using the above-described configuration will be described. However, since the high side and low side of the IPM system 1 are the same in the characteristic action of the present embodiment, hereinafter, the operation of the high side will be described in detail.

The drive/arithmetic circuit 3A generates a gate signal for turning off the IGBT 41A, according to the drive signal from the outside, and supplies the gate signal to the gate terminal of the IGBT section 4A. As a result, the IGBT 41A of the IGBT section 4A starts a turn-off switching operation.

If the IGBT 41A starts the turn-off switching operation, in the turn-off transient state of the IGBT 41A, the freewheeling diode section 5A returns excess carrier of the emitter side of the IGBT 41A to the collector side thereof. Therefore, in the freewheeling diode section 5A, the forward current flows.

Herein, as described above, the characteristics of the forward current which flows in the freewheeling diode section 5A change steeply according to the above-mentioned instantaneous electromotive force e. In other words, in the IGBT 41A formed together with the freewheeling diode section 5A in the same chip, during a turn-off switching operation, the characteristics of the forward current which flows in the freewheeling diode section 5A steeply change due to generation of the instantaneous electromotive force e, and the potential between the gate and the emitter changes in a very short period until the IGBT is completely turned off. This becomes a cause of noise during the turn-off switching, and deteriorates the control properties of the IGBT 41A. This is the same, for example, for the dummy IGBT 42A corresponding to the dummy trench gate provided for improving the breakdown voltage.

However, in the present embodiment, between the gate and emitter of the dummy IGBT 42A, the capacitor CP1 is provided. Since the capacitor CP1 stores charge, change in the charge of the emitter of the dummy IGBT 42A, i.e. the potential between the gate and emitter of the dummy IGBT 42A is suppressed. As a result, it is possible to suppress generation of an instantaneous electromotive force e. Therefore, it becomes possible to suppress noise during turn-off switching of the reverse-conducting IGBT (the IGBT section 4A and the diode section 5A), and accordingly, it becomes possible to improve the control properties of the reverse-conducting IGBT.

Also, although the case of providing the capacitor CP1 between the gate and emitter of the dummy IGBT 42A has been described in the present embodiment in order to facilitate understanding of the present invention, the present invention is not limited thereto, and a capacitor (not shown in the drawings) may be further provided between the gate and emitter of the IGBT 41A. The capacitance of the capacitor may be appropriately set and selected according to a magnitude to which the instantaneous electromotive force is wanted to be suppressed.

Figure 3:
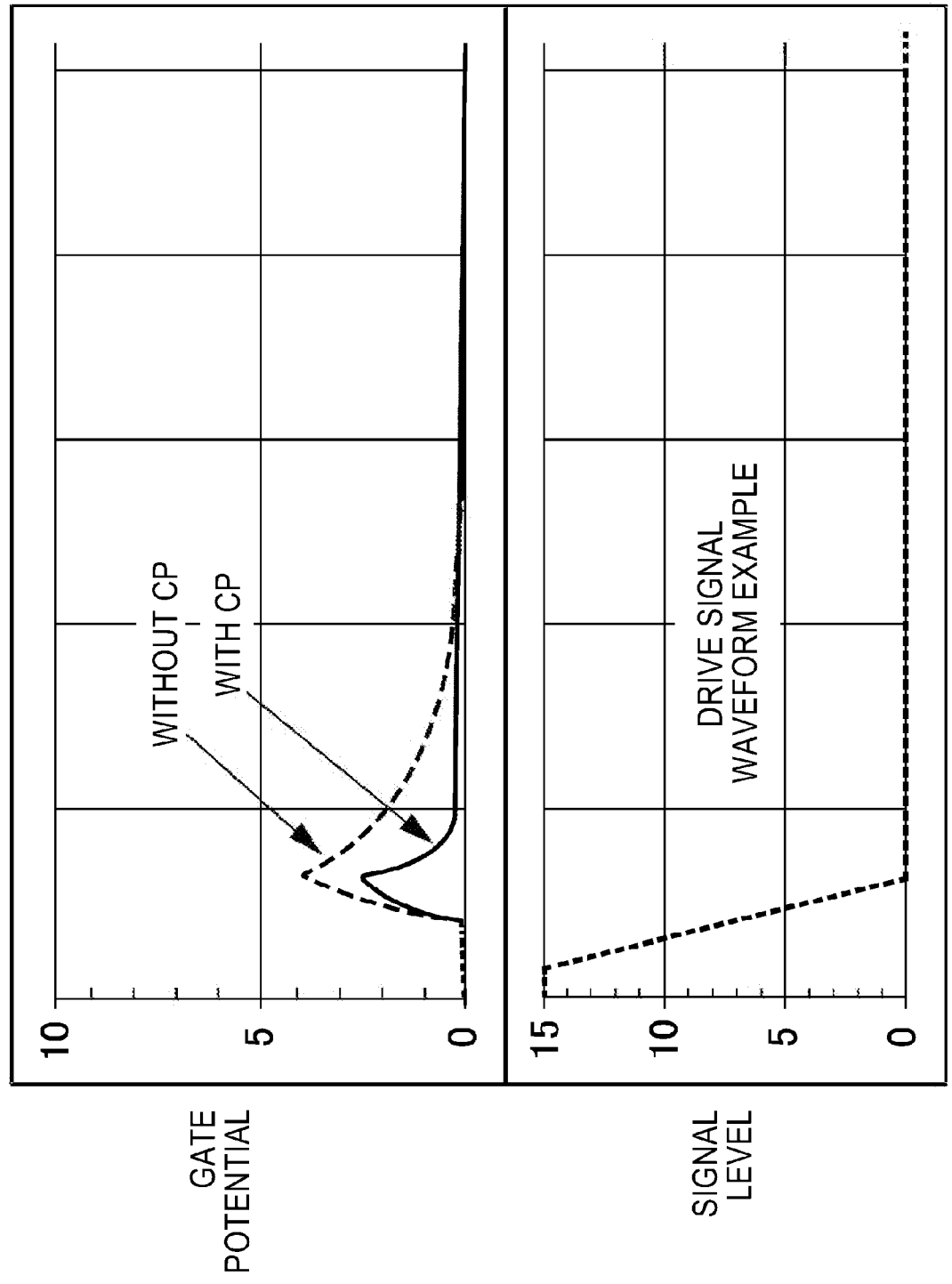
FIG. 3 is a waveform chart illustrating the result of a circuit simulation related to the relation between gate signal and gate potential.

Now, the result of a circuit simulation in the case of providing the capacitor CP1 and so on will be described with reference to FIG. 3. FIG. 3 is a graph illustrating the result of a simulation of the relation between the potential of the dummy trench gate and the signal level of the gate signal with focus on generation of the instantaneous electromotive force e.

As shown in the drawing, while the signal which drives the reverse-conducting IGBT, i.e. the voltage which is applied to the gate of the reverse-conducting IGBT (in FIG. 3, a drive signal waveform example) lowers, for example, from 15 V to 0 V, the reverse-conducting IGBT is in the turn-off transient state; however, in the turn-off transient state, the potential of the dummy trench gate rises according to the above-mentioned instantaneous electromotive force. In the case of providing the capacitor CP1 and so on, as compared to the case where the capacitor CP and so on are not provided, a steep rise in the potential of the gate is suppressed, and the time required to become zero shortens. In other words, it can be seen that according to the present embodiment, by providing the capacitor CP1 and so on, it is possible to reduce the time required for the reverse-conducting IGBT to be completely turn off, i.e. the time required for the reverse-conducting IGBT to become a forward blocking state, as compared to the case where the capacitor CP1 is not provided, so the control properties are improved.

Now, an example of formation of the capacitor CP1 (CP2) as described above will be described with reference to the top views of FIGS. 4A and 4B. However, the top surface shapes shown in the drawing are merely examples, and are provided in order to facilitate understanding of the present invention, and the present invention is not limited to these top surface shapes.

Figure 4A:
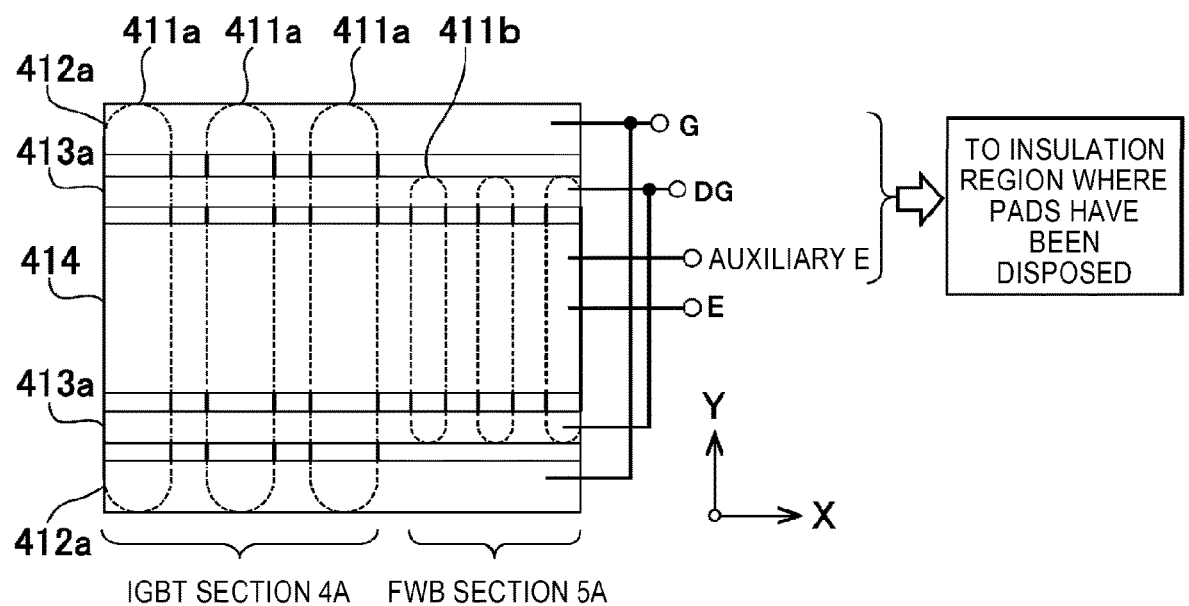
FIGS. 4A and 4B are top views illustrating an example related to formation of a capacitor.

FIG. 4A is a view illustrating the power semiconductor module chip of the reverse-conducting IGBT (including the IGBT section 4A and the diode section 5A) as seen from above. As shown in the drawing, the power semiconductor module chip includes a plurality of trench gates 411a and 411b extending in a Y direction in the drawing, and on them, gate wires 412a and 412b, dummy gate wires 413a and 413b, and an emitter wire 414 are formed so as to extend in an X direction and have some parts electrically connected to the trench gates, respectively. In this power semiconductor module chip, for example, three trench gates 411a on the left side of the drawing form the IGBT section 4A, and three trench gates 411b on the left side form the freewheeling diode section 5A.

In the power semiconductor module chip having this configuration as seen from above, the gate wires 412a and 412b, the dummy gate wires 413a and 413b, and the emitter wire 414 are connected to the gate terminal G, a dummy gate terminal DG, and the emitter terminal E and an auxiliary emitter terminal AE, respectively.

In the power semiconductor module chip using this configuration, at an arbitrary position in the thickness direction of the power semiconductor module chip, an insulation separation region Is is provided. This insulation separation region Is is an inactive region which is formed at a position where current does not flow and voltage is not applied, and is normally configured on a p-well, and as shown in FIG. 4B, pads which are electrically connected to the above-mentioned terminals are formed. More specifically, in the insulation separation region Is, a dummy gate pad 415 which is connected to the dummy gate terminal DG, an emitter pad 416 which is connected to the emitter terminal E, a gate pad 417 which is connected to the gate terminal G, and an auxiliary emitter pad 418 which is connected to the auxiliary emitter terminal AE are formed. Also, the auxiliary emitter pad 418 is, for example, a pad which is connected to the ground of the drive/arithmetic circuit. Also, although the insulation region Is which is shown in FIG. 4B is shown with expanded area in order to facilitate understanding of the present invention, the actual area is much smaller than the area of the entire power semiconductor module chip shown in FIG. 4A.

In the insulation region Is having this configuration, the emitter pad 416 is a so-called floating layer in the manufacturing stage of the power semiconductor module chip including the IGBT section 4A and the diode section 5A, and after a screening examination is completed, the emitter pad 416 is formed. In this insulation region Is, between the emitter pad 416 and the dummy gate pad 415, the capacitor CP1 is disposed. This capacitor CP1 can be formed by an arbitrary method of known methods.

Second Embodiment

In the first embodiment, the case of providing the capacitors CP1 and CP2 between the gates and emitters of the dummy IGBTs 42A and 42B has been described. In this case, the capacitors CP1 and CP2 store charge; however, from a viewpoint of storing charge, even if bidirectional diodes are provided, it is possible to obtain the same action and effects. Hereinafter, an embodiment using bidirectional diodes will be described. Also, components identical to those of the first embodiment will be denoted by the same reference symbols, and a detailed description thereof will not be made below.

Figure 5A:
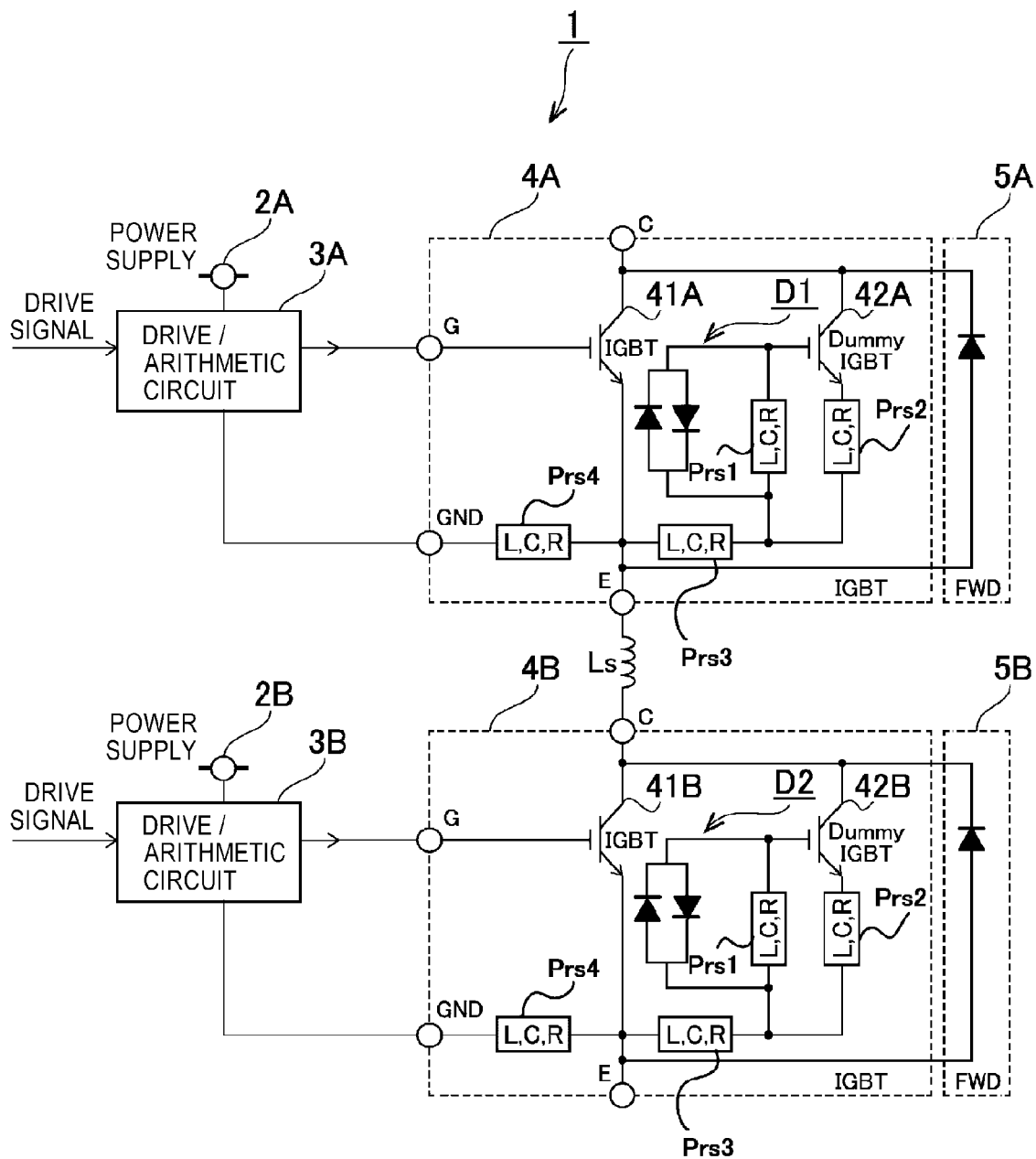
FIG. 5A is a circuit diagram illustrating the configuration of a power module according to a second embodiment of the present invention.

As shown in FIG. 5A, in the present embodiment, between the gate and emitter of each of the dummy IGBTs 42A and 42B, at least one pair of bidirectional diodes D1 or D2 are formed. These bidirectional diodes D1 and D2 can be formed, for example, by diffusing a p-type impurity and an n-type impurity in polysilicon. However, the materials and the forming method are not limited thereto, and can be appropriately selected.

The bidirectional diodes D1 and D2 act as buffer circuits. More specifically, in order for the diodes D1 or D2 to become a conductive state, a predetermined amount of carrier is stored at the p-n junction. Therefore, according to the time of the storing action, it is possible to lengthen dt of the current change rate di/dt of the reverse-conducting IGBT (the IGBT section 4A and the diode section 5A, or the IGBT section 4B and the diode section 5B). Therefore, it is possible to suppress generation of an instantaneous electromotive force and suppress generation of noise. In other words, the bidirectional diodes D1 (D2) are examples of charge storage elements of the present embodiment.

Figure 5B:
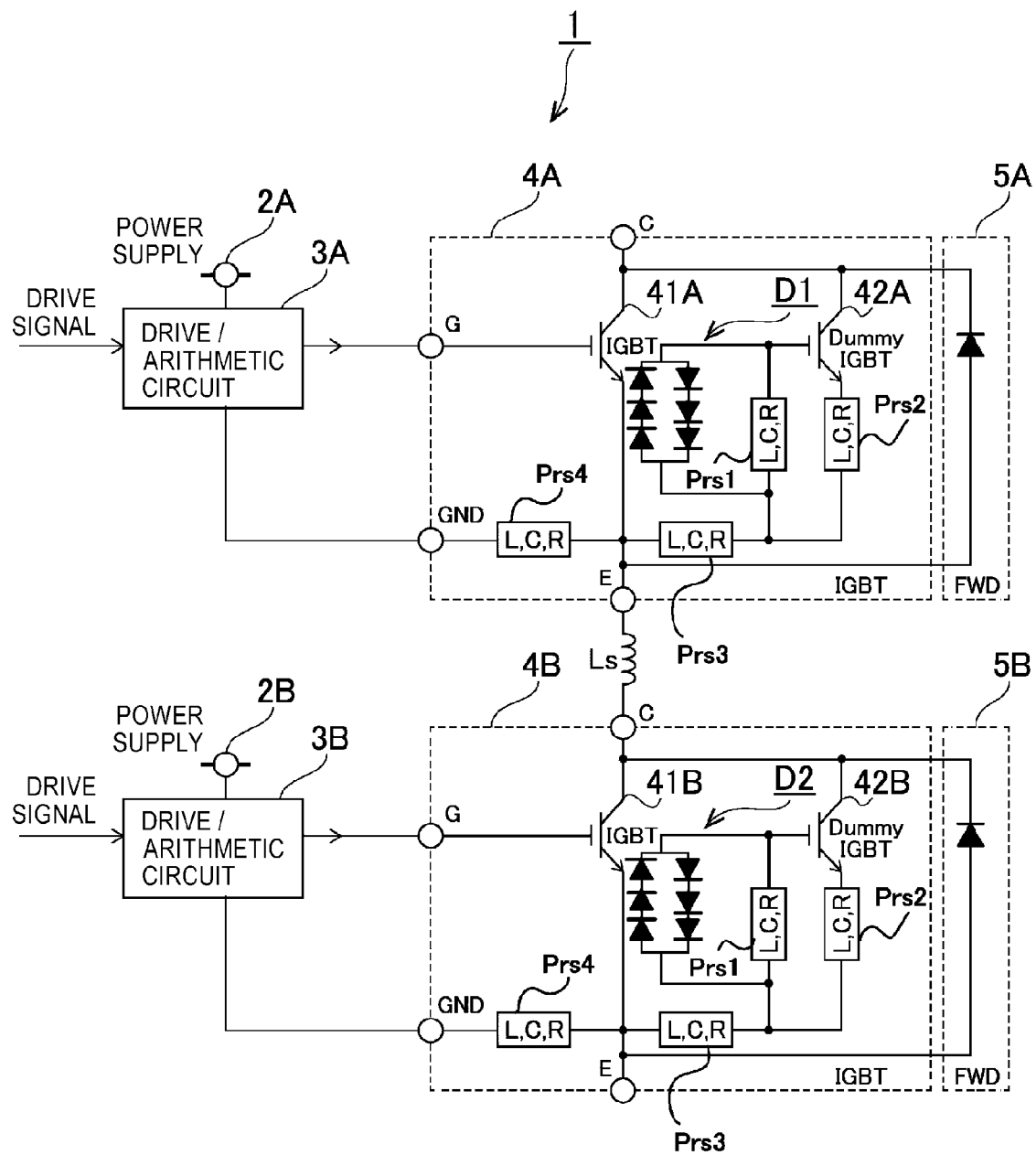
FIG. 5B is a circuit diagram illustrating the configuration of a power module according to another example of FIG. 5A.

Also, as shown in FIG. 5B, a configuration in which a plurality of pairs of bidirectional diodes D1 (D2) is connected in series with each dummy IGBT 42A (42B) may be used. In this case, the breakdown voltage of each pair and the number of pairs are appropriately set such that such a delay time that it is possible to absorb noise is obtained in a system to which the reverse-conducting IGBTs (the IGBT section 4A and the diode section 5A, and so on) are applied. By connecting the pairs of bidirectional diodes D1 (D2) in series in a plurality of stages, it is possible to further lengthen the time of the storing action. Therefore, there is an advantage that it is possible to appropriately adjust the time of the storing action by the number of pairs of bidirectional diodes D1 (D2) which are connected in series.

Figure 6A:
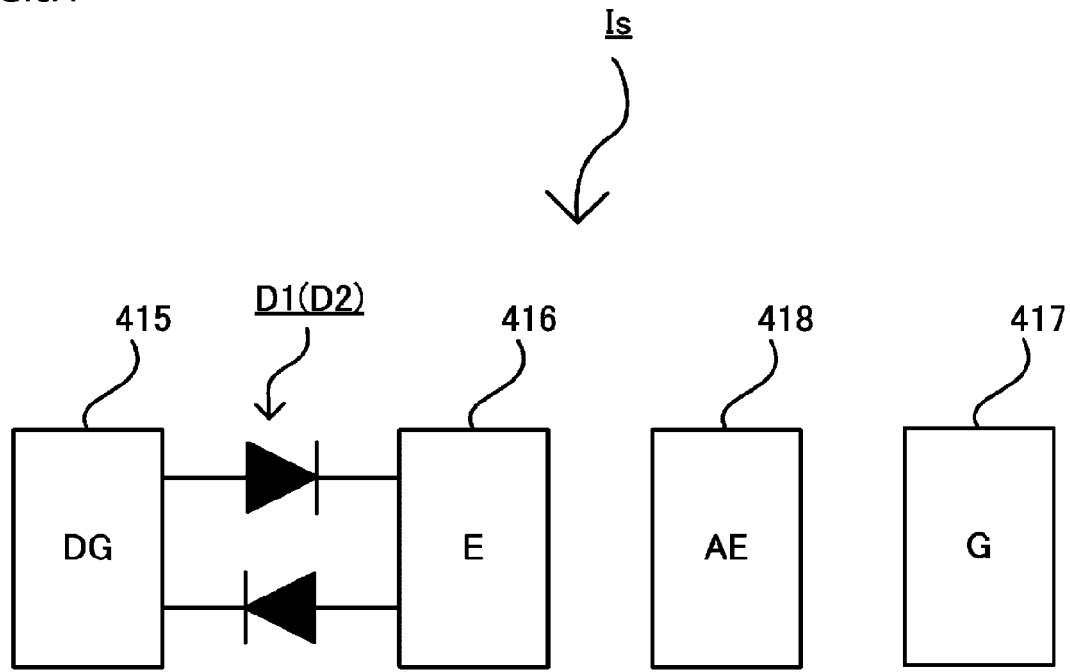
FIGS. 6A and 6B are top views illustrating an example related to formation of bidirectional diodes, and are top views corresponding to FIG. 4B.
Figure 6B:
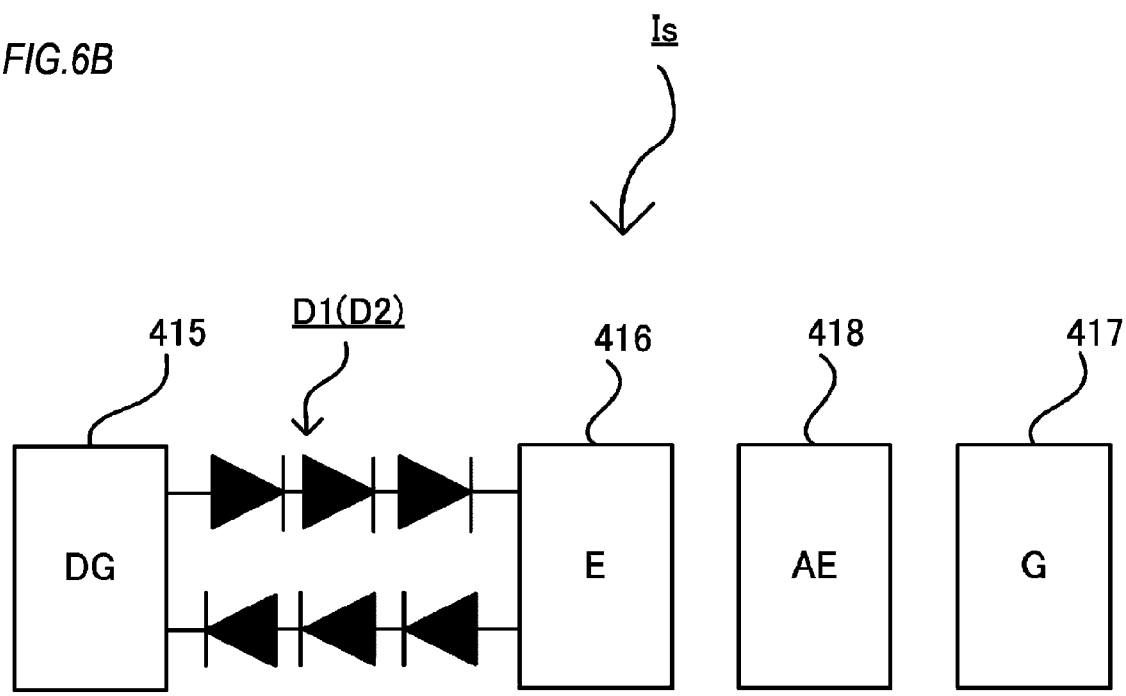

Formation of these bidirectional diodes D1 (D2) will be described with reference to FIGS. 6A and 6B. Also, FIGS. 6A and 6B are views corresponding to FIG. 4B. In the case of the present embodiment, as shown in FIGS. 6A and 6B, on the insulation separation region Is, one pair or a plurality of pairs of bidirectional diodes D1 or D2 can be formed by disposing, for example, polysilicon between the dummy gate pad 415 and the emitter pad 416 and diffusing a p-type impurity and an n-type impurity.

Third Embodiment

In the above-described first and second embodiments, the case where charge storage elements which are exemplified by the capacitor CP1, the diode D1, and so on are elements which are connected after a screening examination is completed has been described. However, according to needs for actual products, there is a demand for further improving the noise suppressing effect, and to this end, a demand for avoiding the necessity for screening examinations is also considered. In this case, it is possible to deal with the demands by providing a charge storage element between one of the dummy gate wires 413a and 413b and the emitter wire 414 on the top surface shown in FIG. 4A.

Figure 7A:
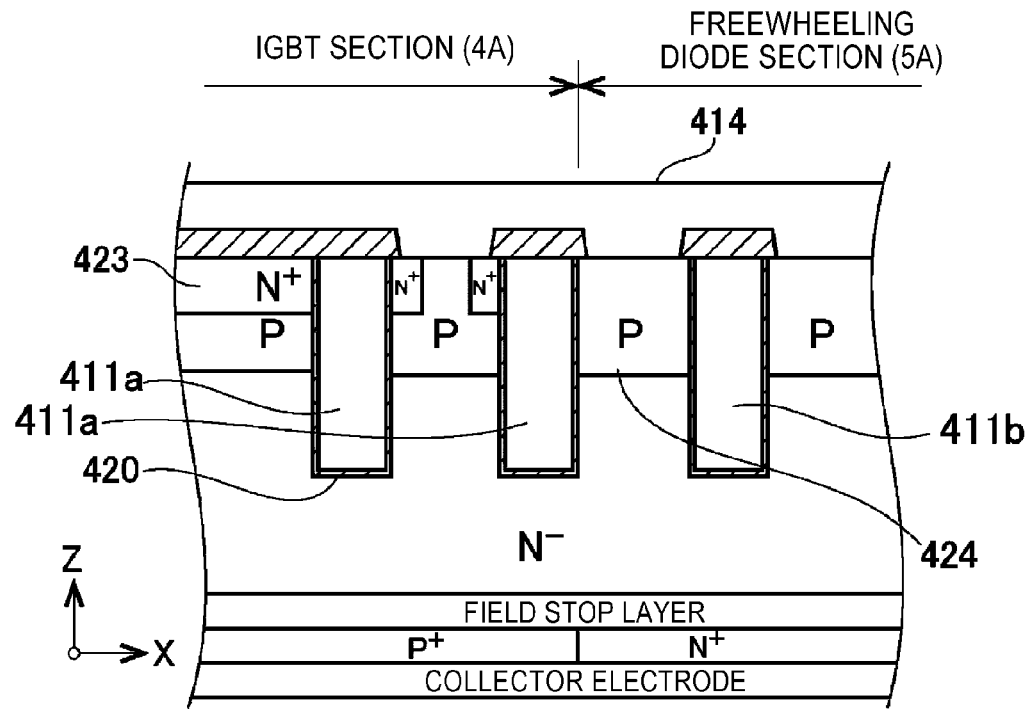
FIG. 7A to 7D are views for explaining a third embodiment of the present invention in which a charge storage element is formed between a dummy gate wire and an emitter wire.
Figure 7B:
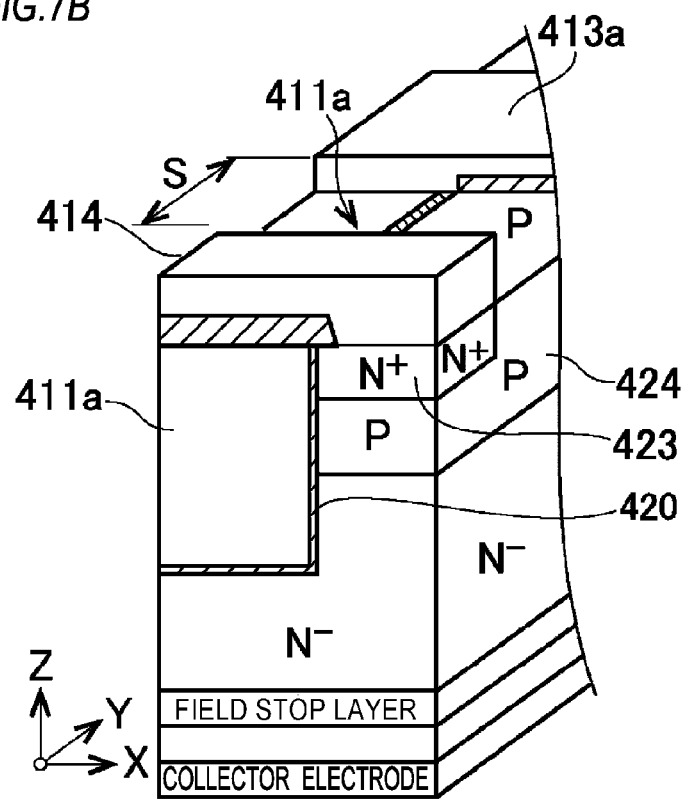

Hereinafter, a third embodiment dealing with these demands will be described with reference to FIG. 7A to FIG. 7D. The power semiconductor module chip having the configuration shown in FIG. 4A has, for example, a configuration as shown in FIG. 7A as a cross section is seen. In the Y direction shown in FIG. 4A and FIG. 7B, on the top surface of the power semiconductor module chip, between the emitter wire 414 and the dummy gate wire 413a, a space S having a predetermined distance exists. In this space S, a charge storage element is formed. Also, the Y direction in FIG. 4A and FIG. 7B is a direction in which the gate extends, and a Z direction shown in FIG. 4A is the thickness direction of the power semiconductor module chip, i.e. the longitudinal direction. Also, as shown in FIGS. 7A and 7B, on both sides of the trench gate 411a, emitter regions 423 are formed in a P-well 424 so as to be adjacent to the trench gate 411a with an oxide film 420 interposed therebetween.

Figure 7C:
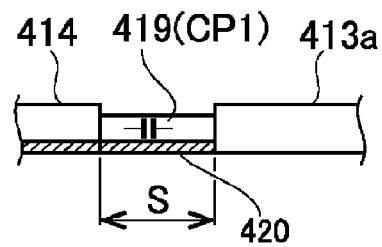

In the case of forming the capacitor CP1 and so on as charge storage elements, as shown in FIG. 7C, in the space between the emitter wire 414 and the dummy gate wire 413a, a dielectric 419 is formed on an insulting film 420. In the case of this configuration, since a part of the emitter wire 414 and a part of the dummy gate wire 413a also act as one electrode and the other electrode of the capacitor CP1, respectively, it is possible to omit the process of separately forming the electrodes of polysilicon or the like with the dielectric 419 interposed therebetween.

Figure 7D:
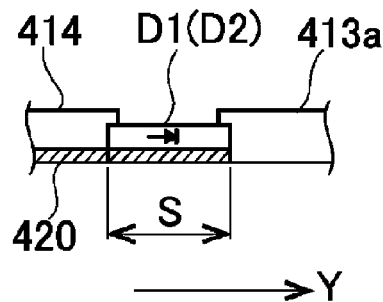

Meanwhile, in the case of forming the bidirectional diodes D1 and so on as charge storage elements, as shown in FIG. 7D, the bidirectional diodes D1 and so on are formed by forming polysilicon in the space S so as to be partially buried in each of the emitter wire 414 and the dummy gate wire 413a and appropriately diffusing a p-type impurity and an n-type impurity.

Figure 4B:
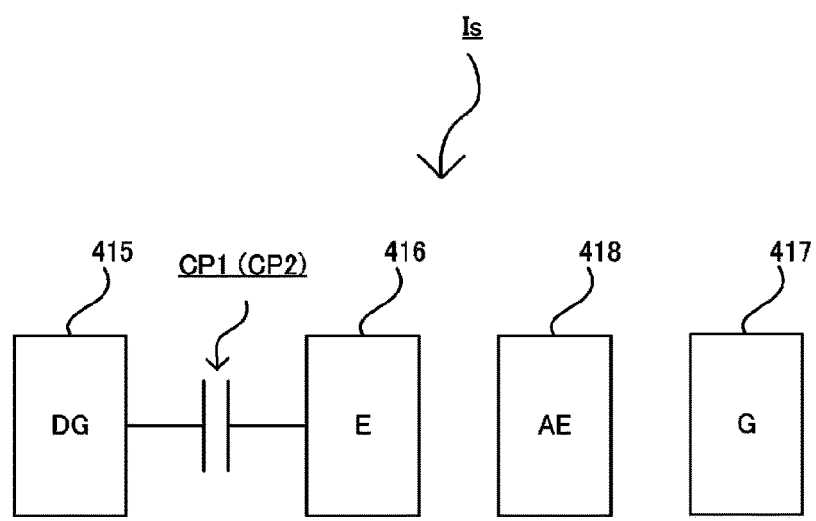

In the case of the configuration shown in FIG. 7A to of FIG. 7D, since the charge storage element is connected directly to the emitter wire 414 and the dummy gate wire 413a, it is difficult to perform a screening examination on the dummy gate; however, as compared to the configuration shown in FIG. 4B, since the charge storage element is connected directly to the dummy gate wire 413a, the noise suppressing effect is higher. Also, in the present embodiment, the case of forming the charge storage element between the emitter wire 414 and the dummy gate wire 413a has been described; however, even if a charge storage element is formed between the emitter wire 414 and the dummy gate wire 413b, the same effects are obtained.

Figure 8:
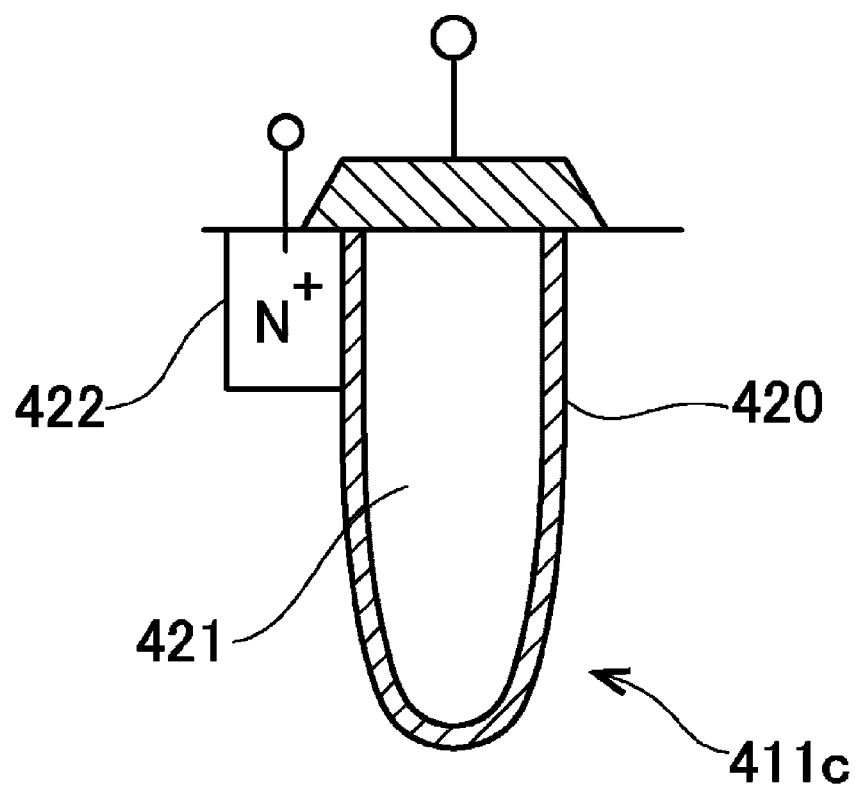
FIG. 8 is a cross-sectional view illustrating another example related to formation of a capacitor.

Although the embodiments of the present invention have been described above, the present invention is not limited to the above-described embodiments, and various replacements, omissions, and changes are possible without departing from the technical scope thereof. For example, in FIG. 7C, the case of forming the capacitor CP1 using the dielectric 419 has been described; however, the present invention is not limited to this configuration. As shown in FIG. 8, it also is possible to form a trench 411c different from the trench gate 411a and so on, and form the oxide film 420 on the inner wall of the trench 411c, and fill polysilicon 421 in it, and forming, for example, an N+ layer 422 outside the trench 411c, thereby forming the capacitor CP1 for storing charge or the like on the oxide film 420 in the trench 411c. This trench 411c does not need to have the same shape as that of the trench gate 411a, and may be, for example, hemispherical.

Figure 9A:
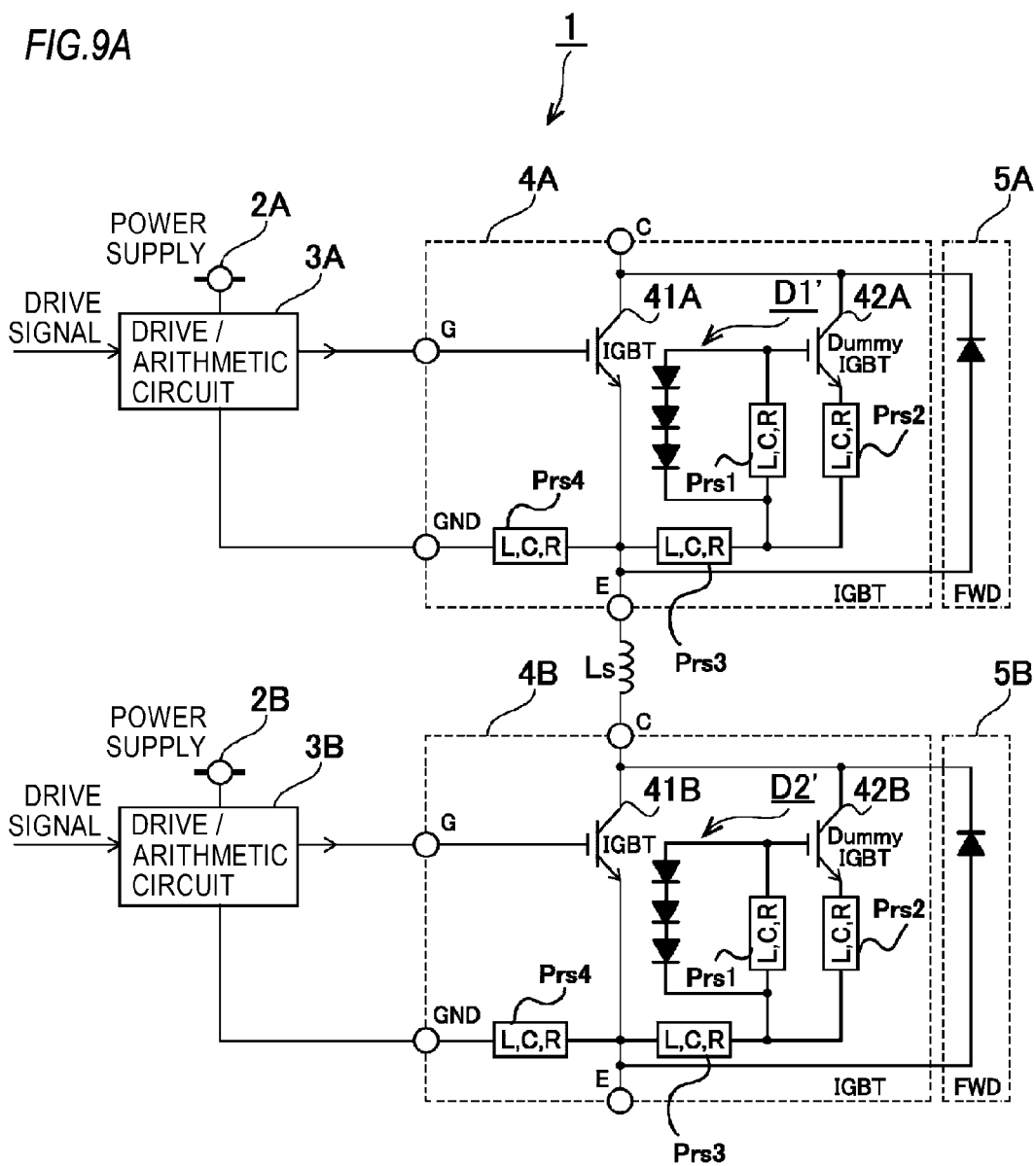
FIGS. 9A and 9B are schematic diagrams illustrating a modification of the second embodiment.
Figure 9B:
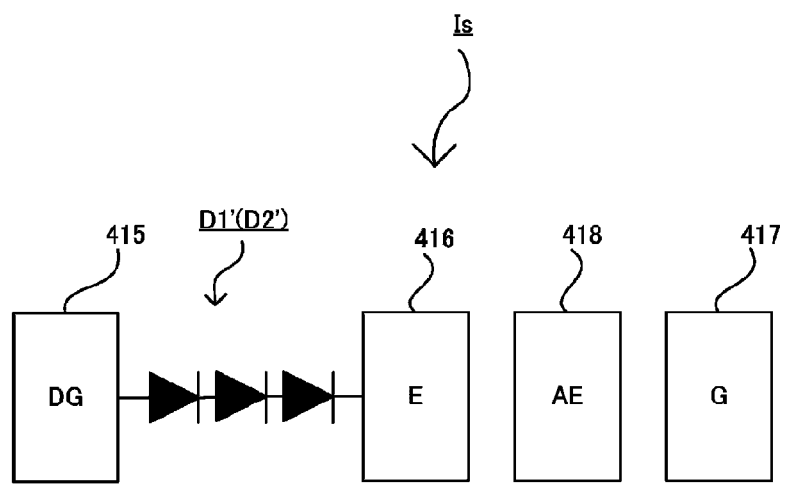

Also, in the second embodiment, the case of forming the bidirectional diodes D1 and so on as charge storage elements has been described; however, the present invention is not limited to this case. For example, as shown in FIGS. 9A and 9B, instead of one pair or a plurality of pairs of bidirectional diodes D1, one or more reverse diodes D1' (D2') may be provided. In the characteristic example shown in FIG. 1, if it is possible to secure the breakdown voltage of about 7 V, since it is possible to suppress change in the characteristic, the same action and effects as those of the above-described embodiments are obtained. For this reason, the breakdown voltage of each diode D1' and the number of diodes are appropriately set such that such a delay time that it is possible to absorb noise is obtained in a system to which the reverse-conducting IGBTs (the IGBT section 4A and the diode section 5A, and so on) are applied. Even if the reverse diodes D1' and so on having such breakdown voltages are provided, it is possible to perform screening examinations on the gate oxide film of the dummy trench gate (shown in FIG. 4A). Therefore, it is possible to provide them at arbitrary positions in the power semiconductor module chip including the reverse-conducting IGBTs.

The invention claimed is:
1. A power module, comprising:
   a power semiconductor module chip, including:
      an IGBT having a trench gate structure including a dummy trench gate, and
      a freewheeling diode for returning excess carrier of an emitter of the IGBT to a collector of the IGBT;
   a drive chip configured to drive the IGBT, the power semiconductor module chip and the drive chip being packaged together; and
   a charge storage element that is connected between a gate and an emitter of a dummy IGBT which can be pseudo-formed in order that the dummy trench gate is usable in screening examinations.

2. The power module according to claim 1, wherein:
the charge storage element is a capacitor.

3. The power module according to claim 1, wherein:
the charge storage element is-includes at least one pair of bidirectional diodes connected in antiparallel.

4. The power module according to claim 1, wherein:
the charge storage element is included in the power semiconductor module chip.

5. The power module according to claim 1, wherein:
the charge storage element is electrically connectable between the gate and the emitter of the dummy IGBT after a screening examination is completed.

6. The power module according to claim 1, wherein:
the charge storage element is-includes at least one reverse diode.

7. A reverse-conducting IGBT, comprising:
an IGBT having a trench gate structure including a dummy trench gate;
a freewheeling diode for returning excess carrier of an emitter of the IGBT to a collector of the IGBT, the IGBT and the freewheeling diode being formed in a same chip; and
a charge storage element connected between a gate and an emitter of a dummy IGBT which can be pseudo-formed in order that the dummy trench gate is usable in screening examinations.

8. The reverse-conducting IGBT according to claim 7, wherein:
the charge storage element is a capacitor.

9. The reverse-conducting IGBT according to claim 7, wherein:
the charge storage element includes at least one pair of bidirectional diodes connected in antiparallel.

10. The reverse-conducting IGBT according to claim 7, wherein:
the charge storage element is formed in the same chip as the IGBT and the freewheeling diode.

11. The reverse-conducting IGBT according to claim 7, wherein:
the charge storage element is electrically connectable between the gate and the emitter of the dummy IGBT after a screening examination is completed.

12. The reverse-conducting IGBT according to claim 7, wherein:
the charge storage element includes at least one reverse diode.

* * * * *